(12) United States Patent
Chang et al.

(10) Patent No.: US 10,121,694 B2
(45) Date of Patent: Nov. 6, 2018

(54) METHODS OF MANUFACTURING A SEMICONDUCTOR DEVICE

(71) Applicant: Taiwan Semiconductor Manufacturing Company, Ltd., Hsin-Chu (TW)

(72) Inventors: Yu-Jung Chang, Zhubei (TW); Chin-Chang Hsu, Banqiao (TW); Ying-Yu Shen, Chiayi (TW); Nien-Yu Tsai, Taichung (TW); Wen-Ju Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 577 days.

(21) Appl. No.: 14/519,829

(22) Filed: Oct. 21, 2014

(65) Prior Publication Data
US 2016/0035615 A1 Feb. 4, 2016

Related U.S. Application Data

(60) Provisional application No. 62/031,292, filed on Jul. 31, 2014.

(51) Int. Cl.
| | |
|---|---|
| *H01L 21/768* | (2006.01) |
| *G06F 17/50* | (2006.01) |
| *H01L 23/522* | (2006.01) |
| *H01L 23/528* | (2006.01) |
| *H01L 23/532* | (2006.01) |

(52) U.S. Cl.
CPC ...... *H01L 21/7682* (2013.01); *G06F 17/5072* (2013.01); *G06F 17/5081* (2013.01); *H01L 23/528* (2013.01); *H01L 23/5222* (2013.01); *H01L 23/53295* (2013.01); *H01L 2224/13* (2013.01); *H01L 2924/0002* (2013.01)

(58) Field of Classification Search
CPC .................. G06F 17/5081; H01L 21/7682
USPC .......................................... 438/778
See application file for complete search history.

(56) References Cited

U.S. PATENT DOCUMENTS

| | | | | |
|---|---|---|---|---|
| 6,815,329 | B2 * | 11/2004 | Babich ................ | H01L 21/7681 257/E21.579 |
| 2010/0064270 | A1 * | 3/2010 | Aguado Granados | ..................... G06F 17/5068 716/106 |
| 2010/0270671 | A1 * | 10/2010 | Holesovsky ........ | G06F 17/5068 257/734 |

\* cited by examiner

*Primary Examiner* — Moazzam Hossain
*Assistant Examiner* — Warren H Kilpatrick
(74) *Attorney, Agent, or Firm* — Slater Matsil, LLP

(57) ABSTRACT

Methods of manufacturing a semiconductor device are described. In an embodiment, the method may include providing a substrate having a metal layer disposed thereon, the metal layer having a conductive trace pattern formed therein; depositing a dielectric material over the conductive trace pattern of the metal layer; determining a layout of a plurality of air gaps that will be formed in the dielectric material based on a design rule checking (DRC) procedure and the conductive trace pattern; and forming the plurality of air gaps in the dielectric material based on the layout of the plurality of air gaps.

20 Claims, 16 Drawing Sheets

METHODS OF MANUFACTURING A SEMICONDUCTOR DEVICE

PRIORITY CLAIM AND CROSS-REFERENCE

This application claims the benefit of the following provisionally filed U.S. patent application: Application Ser. No. 62/031,292, filed Jul. 31, 2014, and entitled "Method for Air Gap Region Auto-Generation," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various circuit components (e.g., conductive lines, transistors, diodes, resistors, capacitors, etc.) by continual reductions in minimum feature size, which allow more components to be integrated into a given area. However, as integration density increases, adjacent circuit components are spaced closer together and this can result in parasitic capacitive coupling between adjacent circuit components, which in turn can lead to several disadvantages.

One disadvantage is cross-talk or electromagnetic interference between adjacent circuit components. For example, a signal present on a metallization line may interfere with another signal present on an adjacent metallization line. Another disadvantage associated with close proximity of circuit components is the potential increased signal delay (e.g. RC delay) and reduction in frequency bandwidth. For example, the presence of a grounded metallization layer in proximity to a metallization layer carrying a signal may decrease the signal propagation speed leading to possible delay errors. Also, a grounded layer that is in close proximity may reduce the frequency bandwidth of the signal on an adjacent metallization line.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
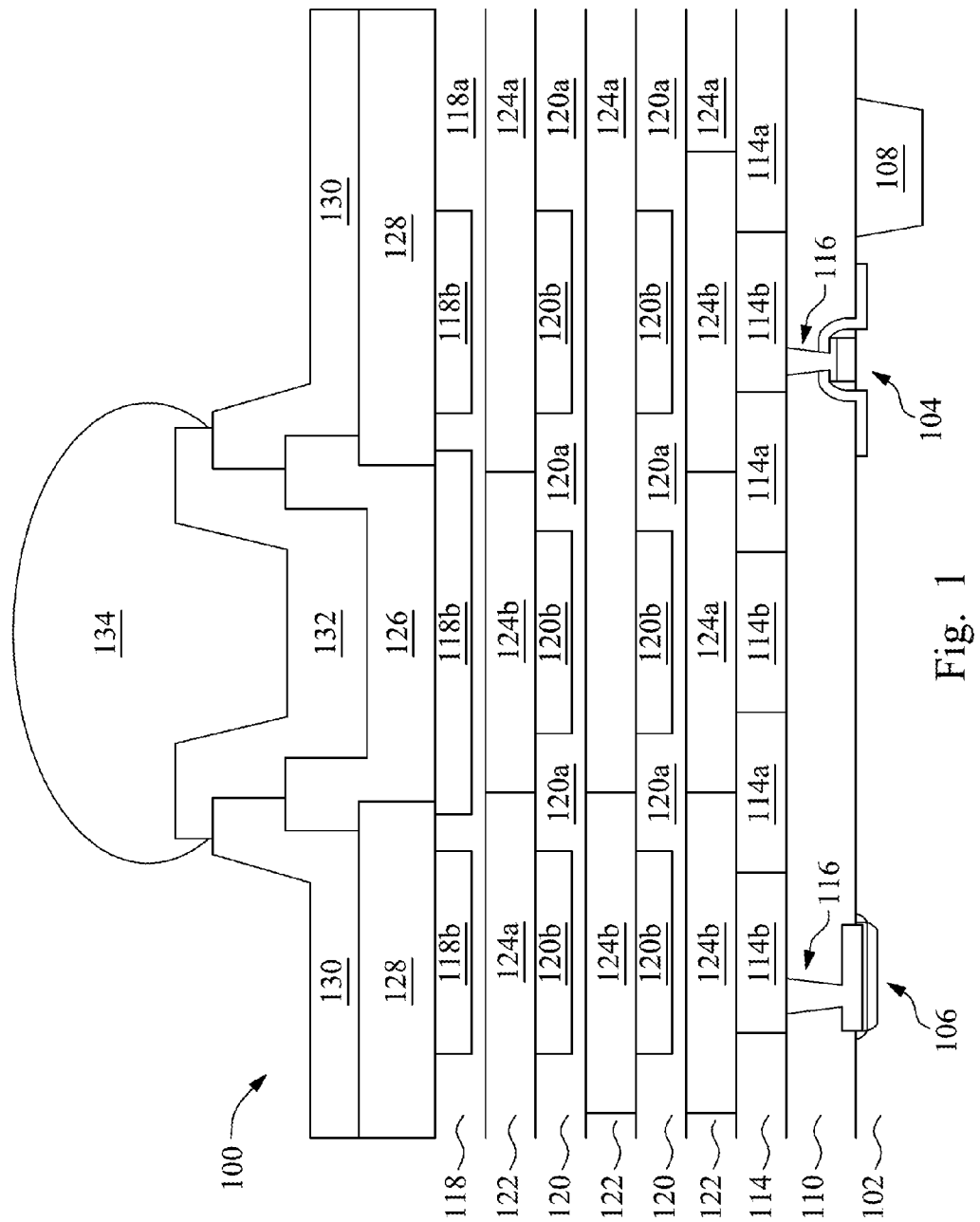
FIG. 1 shows a semiconductor device, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of a semiconductor device 100, in accordance with one or more embodiments. The semiconductor device 100 shown in FIG. 1 may be a portion of a semiconductor chip or a portion of a semiconductor chip package, as an example. The semiconductor device 100 may include a substrate 102. The substrate 102 may include a semiconductor substrate, which may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof. The substrate 102 may include an active device and/or a passive device. For example, in the embodiment shown in FIG. 1, the substrate 102 includes an active device 104 (e.g. a transistor) and a passive device 106 (e.g. a resistor, capacitor, inductor, and the like) formed in or over the substrate 102. The substrate 102 shown in the example of FIG. 1 also includes an isolation area 108, which may be a shallow trench isolation area (STI).

The semiconductor device 100 may include a first insulating layer 110 disposed over a surface of the substrate 102 having the active device 104 and the passive device 106, as an example. As shown in the example of FIG. 1, the first insulating layer 110 may cover at least a portion of the passive device 106 and at least a portion of the active device 104 (e.g. a gate of a transistor). The first insulating layer 110 may be an inter-layer dielectric (ILD) layer that may be disposed between the substrate 102 and metallization layers of the semiconductor device 100. The first insulating layer 110 may include one or more suitable dielectric materials such as silicon oxide, silicon nitride, low-k dielectrics such as carbon doped oxides, extremely low-k dielectrics such as porous carbon doped silicon dioxide, the like, or a combination thereof. The first insulating layer 110 may be formed over the substrate 102 using suitable processes such as chemical vapor deposition (CVD), plasma enhanced CVD (PECVD), and the like.

The semiconductor device 100 may include one or more vias 116 that extend through at least a portion of the first insulating layer 110. Only two vias 116 are shown as an example, however, the number of vias 116 may be less than two (e.g. one via) or more than two (e.g. three, four, five, six, or more vias) in accordance with other embodiments. The one or more vias 116 may electrically connect metallization layers of the semiconductor device 100 to the substrate 102 (e.g. to the active device 104 and the passive device 106 of the substrate 102). The one or more vias 116 may be filled with a conductive material, such as copper, aluminum, tungsten, nickel, palladium, gold, combinations thereof, and the like. The one or more vias 116 may be formed in the first insulating layer 110 by initially forming one or more openings in the first insulating layer 110 (e.g. by means of an etching and/or lithographic process) and subsequently filling the one or more openings with conductive material, thereby forming the one or more vias 116. In some embodiments, a plating process may be used to fill the one or more openings formed in the first insulating layer 110. The plating process may include electroplating, electroless plating, and the like. However, in other embodiments, a deposition process may be used to fill the one or more openings formed in the first insulating layer 110. It is also noted that other suitable methods of filling the one or more openings formed in the first insulating layer 110 may be possible as well.

The semiconductor device 100 may include a bottom metal layer 114 formed over a surface of the first insulating layer 110 facing away from the substrate 102. The bottom metal layer 114 may be a first metallization layer (e.g. M1) of the semiconductor device 100. The bottom metal layer 114 may include a dielectric material 114a having a plurality of bottom conductive traces 114b formed therein. Only three bottom conductive traces 114b are shown as an example, however, the number of bottom conductive traces 114b may be less than three (e.g. one or two bottom conductive traces) or more than three (e.g. four, five, six, or more bottom conductive traces) in accordance with other embodiments. The plurality of bottom conductive traces 114b may be laterally adjacent to and spaced apart from each other, as shown in FIG. 1. As shown in the example of FIG. 1, the plurality of bottom conductive traces 114b may extend through at least a portion of the dielectric material 114a of the bottom metal layer 114. Furthermore, at least one of the plurality of bottom conductive traces 114b may be disposed over and/or may be electrically connected to the one or more vias 116, as shown in the example of FIG. 1.

The dielectric material 114a of the bottom metal layer 114 may include similar materials as the first insulating layer 110. Furthermore, the plurality of bottom conductive traces 114b of the bottom metal layer 114 may include similar materials as the one or more vias 116. The plurality of bottom conductive traces 114b may be formed in the dielectric material 114a of the bottom metal layer 114 using similar processes as the one or more vias 116. For example, the dielectric material 114a may be formed over the first insulating layer 110 using suitable processes such CVD, PECVD, and the like. Thereafter, a plurality of openings may be formed in the dielectric material 114a (e.g. by means of an etching and/or lithographic process). The plurality of openings may be subsequently filled with a conductive material, thereby forming the plurality of bottom conductive traces 114b. The processes used for filling the plurality of openings formed in the dielectric material 114a may be similar to the processes used for filling the one or more openings formed in the first insulating layer 110.

The semiconductor device 100 may include a top metal layer 118 formed over a surface of the bottom metal layer 114 facing away from the substrate 102. The top metal layer 118 may be a metallization layer of the semiconductor device 100 that is farthest from the substrate 102. For example, the top metal layer 118 may be the top-most metallization layer (e.g. Mz) of the semiconductor device 100. The top metal layer 118 may include a dielectric material 118a having a plurality of top conductive traces 118b formed therein. Only three top conductive traces 118b are shown as an example, however, the number of top conductive traces 118b may be less than three (e.g. one or two top conductive traces) or more than three (e.g. four, five, six, or more top conductive traces) in accordance with other embodiments. The plurality of top conductive traces 118b may be laterally adjacent to and spaced apart from each other, as shown in FIG. 1. The plurality of top conductive traces 118b may include similar materials as the plurality of bottom conductive traces 114b.

The semiconductor device 100 may include a plurality of middle metal layers 120 disposed between the top metal layer 118 and the bottom metal layer 114. Only two middle metal layers 120 are shown as an example, however, the number of middle metal layers may be less than two (e.g. one) or more than two (e.g. three, four, five, or more middle metal layers) in accordance with other embodiments. Each metal layer of the plurality of middle metal layers 120 may include a dielectric material 120a having a plurality of middle conductive traces 120b formed therein. As an example, only three middle conductive traces 120b for each metal layer of the plurality of middle metal layers 120 are shown, however, the number of middle conductive traces 120b for each metal layer of the plurality of middle metal layers 120 may be less than three (e.g. one or two middle conductive traces) or more than three (e.g. four, five, six, or more middle conductive traces) in accordance with other embodiments. The plurality of middle conductive traces 120b of a respective middle metal layer 120 may be laterally adjacent to and spaced apart from each other, as shown in FIG. 1. The plurality of middle conductive traces 120b may include similar materials as the plurality of bottom conductive traces 114b.

The semiconductor device 100 may include a plurality of inter-metal dielectric (IMD) layers 122 that may separate the bottom metal layer 114, the plurality of middle metal layers 120, and the top metal layer 118 from each other. Only three IMD layers 122 are shown as an example, however, the number of IMD layers may be less than three (e.g. one or two IMD layers) or more than three (e.g. four, five, six, or more IMD layers) in accordance with other embodiments. The precise number of IMD layers 122 may depend on the number of middle metal layers 120, which in turn may depend upon the design of the semiconductor device 100. The plurality of IMD layers 122 may include a dielectric material 124a having a plurality of air gaps 124b formed therein. The number, size, shape, and location of the plurality of air gaps 124b are only for illustration purposes and are not meant to be limiting. The plurality of air gaps 124b may be formed in the dielectric material 124a of plurality of IMD layers 122 by means of an etching and/or lithographic process. Illustratively, the dielectric material 124a of an IMD layer 122 may be formed over a metal layer (e.g. the bottom metal layer 114 or a middle metal layer 122) by means of a suitable process such as CVD, PECVD, and the like. Thereafter, the plurality of air gaps 124b may be formed in the dielectric material 124a by means of an etching and/or lithographic process. The dielectric material 124a of the plurality of IMD layers 122 may include similar materials as the first insulating layer 110. In an embodiment, each of the plurality of IMD layers 122 may have a thickness in a range from about 500 Å to about 30,000 Å, although other thicknesses may be possible as well.

With the reduction of circuit component sizes, the plurality of middle conductive traces 120b, the plurality of top conductive traces 118b, and the plurality of bottom conductive traces 114b are in closer proximity to each other. However, as shown in the example of FIG. 1, the plurality of air gaps 124b may be disposed between these conductive traces, which are disposed at different levels. Consequently, the plurality of air gaps 124b may be provided to prevent or reduce capacitive coupling between conductive traces at different levels. For example, the plurality of air gaps 124b between the plurality of bottom conductive traces 114b and the plurality of middle conductive traces 120b prevent or reduce capacitive coupling between the plurality of bottom conductive traces 114b and the plurality of middle conductive traces 120b. In like manner, the plurality of air gaps 124b between the plurality of top conductive traces 118b and the plurality of middle conductive traces 120b prevent or reduce capacitive coupling between the plurality of top conductive traces 118b and the plurality of middle conductive traces 120b.

As shown in FIG. 1, the plurality of top conductive traces 118b may extend through only a portion of the dielectric material 118a of the top metal layer 118. For example, a surface of the plurality of top conductive traces 118b facing the substrate 102 may not be substantially co-planar with a surface of the dielectric material 118a facing the substrate 102. In other words, the surface of the plurality of top conductive traces 118b facing the substrate 102 may be disposed farther from the substrate 102 than the surface of the dielectric material 118a facing the substrate 102. Similarly, the plurality of middle conductive traces 120b may extend through only a portion of the dielectric material 120a of the plurality of middle metal layers 120. For example, the surface of the plurality of middle conductive traces 120b facing the substrate 102 may be disposed farther from the substrate 102 than the surface of the dielectric material 120a facing the substrate 102. This arrangement may be needed in order to provide mechanical and/or structural support to the plurality of top conductive traces 118b and the plurality of middle conductive traces 120b, some of which may be disposed over the plurality of air gaps 124b.

As shown in FIG. 1, the top metal layer 118 and each of the plurality of middle metal layers 120 are disposed over a respective underlying IMD layer 122. The top metal layer 118 may be formed over its underlying IMD layer 122 by initially forming the dielectric material 118a over its underlying IMD layer 122. Similarly, each of the plurality of middle metal layers 120 may be formed over its respective underlying IMD layer 122 by initially forming the dielectric material 120a over its respective underlying IMD layer 122. The dielectric materials 118a and 120a may be formed over their respective underlying IMD layers 122 by means of a suitable process such as CVD, PECVD, and the like. Since the respective underlying IMD layers 122 have the plurality of air gaps 124b formed therein, the dielectric materials 118a and 120a may have poor gap filling characteristics. This may ensure that the plurality of air gaps 124b of the underlying IMD layers 122 are not filled with the dielectric materials 118a and 120a. Such gap filling characteristics may be attained by selecting and/or modifying a dielectric material to have a sufficiently high molecular weight and/or surface tension characteristic such that the dielectric material 118a and 120a does not substantially sink into the plurality of air gaps 124b.

Once the dielectric materials 118a and 120a are deposited over their respective underlying IMD layer 122, portions of the dielectric materials 118a and 120a may be etched away to form recessed features, such as openings, which can be filled with conductive material thus forming the plurality of top conductive traces 118b and the plurality of middle conductive traces 120b. The processes used for filling the openings formed in the dielectric materials 118a and 120a may be similar to the processes used for filling the one or more openings formed in the first insulating layer 110.

The semiconductor device 100 may include a contact pad 126 that may be formed over a surface of a conductive trace of the plurality of top conductive traces 118b, as shown in FIG. 1. Only one contact pad 126 is shown as an example, however, there may be a plurality of contact pads 126 (e.g. two or more contact pads) disposed over a surface of a conductive trace of the plurality of top conductive traces 118b, in accordance with another embodiment. The contact pad 126 may be include an electrically conductive material, such as aluminum (Al), copper (Cu), tin (Sn), nickel (Ni), gold (Au), silver (Ag), alloys thereof, and the like. The contact pad 126 may be formed using a suitable process, such as electrolytic plating, sputtering, PVD, or electroless plating. The size, shape, and location of the contact pad 126 are only for illustration purposes and are not meant to be limiting. In an embodiment, the contact pad 126 may have a thickness of between about 0.5 μm and about 4 μm, such as about 2 μm, although other thicknesses may be possible as well.

The semiconductor device 100 may include a passivation layer 128, which may be formed over the top metal layer 118 and may include a first opening within which the contact pad 126 is formed or disposed. The passivation layer 128 may be formed over the top metal layer 118 through a process such as CVD, although any suitable process may be utilized. The passivation layer 128 may provide structural support and/or physical isolation to the underlying conductive structures. The passivation layer 128 may include silicon nitride (SiN), silicon dioxide ($SiO_2$), silicon oxynitride (SiON), or other insulating materials. An opening of the passivation layer 128 may be formed by removing a portion of the passivation layer 128 using a mask-defined photoresist etching process to expose the contact pad 126. The size, shape, and location of the opening made are only for illustration purposes and are not meant to be limiting. The passivation layer 128 may have a thickness between about 0.5 μm and about 5 μm, although other thicknesses may be possible as well.

The semiconductor device 100 may include a polymer layer 130, which may be formed over the passivation layer 128. The polymer layer 130 may include a second opening disposed over lateral portions of the contact pad 126. The second opening may be formed by removing a portion of the polymer layer 130 using a mask-defined photoresist etching process to expose the contact pad 126. In an embodiment, the polymer layer 130 may include an epoxy, polyimide, benzocyclobutene (BCB), polybenzoxazole (PBO), and the like, although other relatively soft, often organic, dielectric materials can also be used. In another embodiment, the polymer layer 130 may include an oxide layer or a nitride layer. The polymer layer 130 may be formed over the passivation layer 128 using spin coating, although other suitable methods may be possible as well. The thickness of the polymer layer 130 may be between about 5 μm and about 30 μm, for example.

The semiconductor device 100 may include an under-bump metallization (UBM) layer 132, which may be formed over the contact pad 126, as shown in the example of FIG. 1. The UBM layer 132 may be in electrical contact with the contact pad 126. The UBM layer 132 may include a conductive material, such as copper, tantalum, titanium, nickel, copper, alloys thereof, and the like. The UBM layer 132 may include multiple (e.g. two or more) sub-layers (not shown in FIG. 1). The UBM layer 132 may be formed using suitable processes such as sputtering, evaporation, plating, depending upon the materials included in the UBM layer 132. The UBM layer 132 may have a thickness of between about 0.01 μm and about 10 μm, such as about 5 μm.

The semiconductor device 100 may include an interconnect 134, which may be disposed over the UBM layer 132. The interconnect 134 may include controlled collapse chip connection (C4) bumps and/or micro bumps (e.g. as shown in FIG. 1). In another embodiment, the interconnect 134 may include a ball grid array (BGA). The interconnect 134 may include an electrically conductive material (e.g. a metal or metal alloy). For example, the interconnect 134 may include a solder material. By way of another example, the interconnect 134 may include at least one of tin, lead, copper, gold, silver, zinc, bismuth, magnesium, antimony, indium or an alloy thereof.

Figure 2:
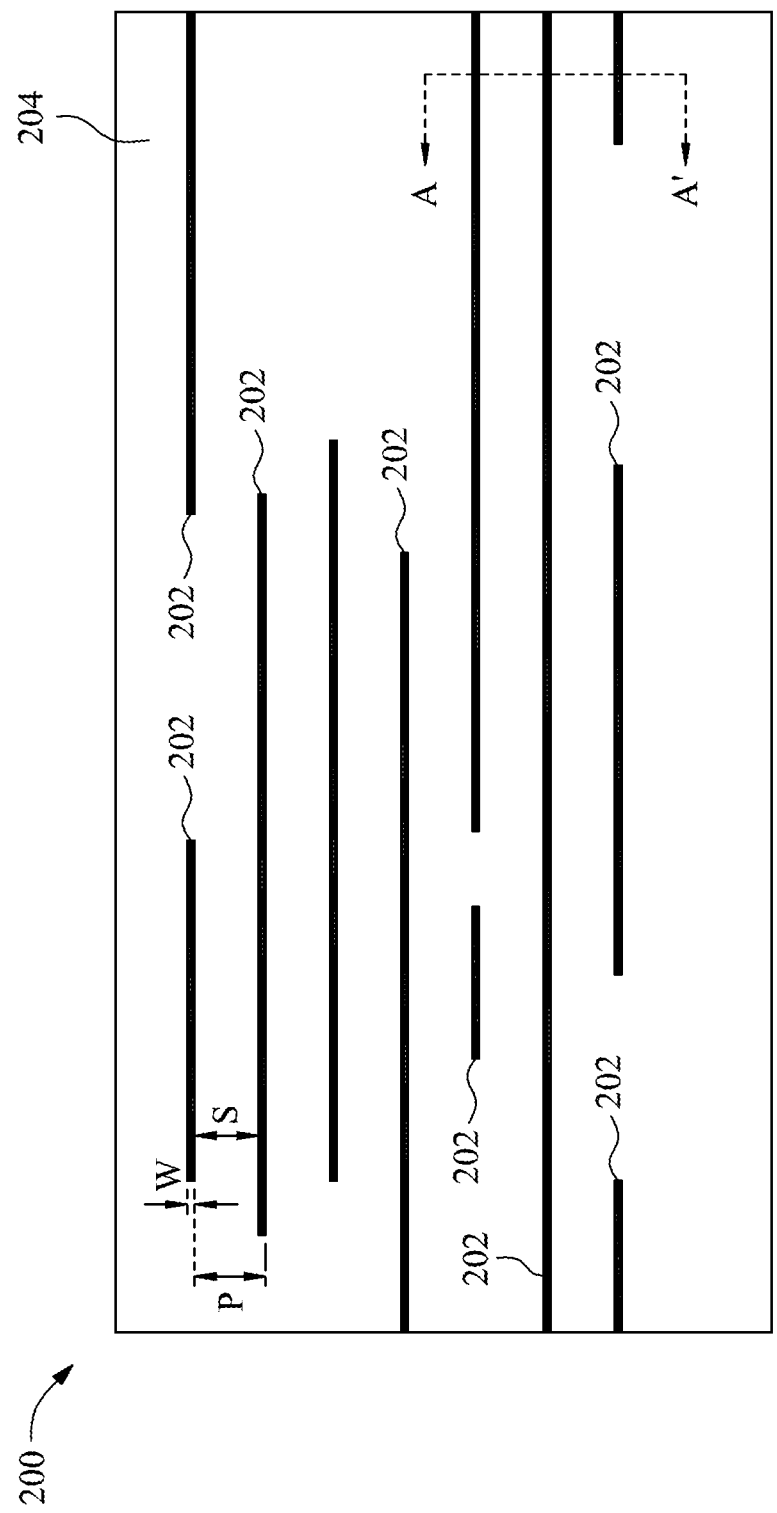
FIG. 2 shows a conductive trace pattern, in accordance with some embodiments.

FIG. 2 shows a plan view of a conductive trace pattern 200, in accordance with one or more embodiments. The conductive trace pattern 200 may be a top view (e.g. a plan view) of the plurality of bottom conductive traces 114b or the plurality of middle conductive traces 120b of one of the plurality of middle metal layers 120. Illustratively, the cross-sectional view of the plurality of bottom conductive traces 114b or the plurality of middle conductive traces 120b of one of the plurality of middle metal layers 120 shown in FIG. 1 may be a view of the conductive trace pattern 200 taken along the line A-A' shown in FIG. 2.

As shown in FIG. 2, the conductive trace pattern 200 may include a plurality of conductive traces 202 extending laterally across a surface 204, which may be a surface of the dielectric material 114a of the bottom metal layer 114 or a surface of the dielectric material 120a of one of the plurality of middle metal layers 120. The plurality of conductive traces 202 may have a pitch P. For example, the plurality of conductive traces 202 may each have a width W, and immediately adjacent conductive traces of the plurality of conductive traces 202 may be separated by a distance S. Consequently, the pitch P may be the sum of the width W and the spacing S. In some embodiment, the pitch P may be in the range from about 1 μm to about 10 μm, although other distances may be possible as well.

In relation the FIG. 1 and FIG. 2, during manufacture of the semiconductor device 100, the dielectric material 124a of the IMD layer 122 may be deposited over the conductive trace pattern 200 by means of a suitable process such as CVD, PECVD, and the like. Subsequently, the plurality of air gaps 124b may be formed (e.g. by an etching and/or lithographic process) in dielectric material 124a. During manufacture of the semiconductor device 100 shown in FIG. 1, the position and layout of the plurality of air gaps 124b needs to be chosen such that certain design rules are fulfilled. Such design rules may be needed for the etching and/or lithographic processes that are used to form the plurality of air gaps 124b. These design rules include avoiding violations of minimum widths, point touches, enclosed areas, and wide areas (e.g. wide metal areas), as examples. A method of manufacturing the semiconductor device 100 that efficiently generates the plurality of air gaps 124b while fulfilling these design rules is needed. It would be advantageous if such a method avoids the need for iteratively checking if these design rules are fulfilled. It would also be advantageous if such a method generates the plurality of air gaps 124b automatically, without the need for manual intervention. Even further, it would be advantageous if such a method maximizes the region of dielectric material 124a in which the plurality of air gaps 124b is formed in order to maximize the capacitive decoupling between conductive traces at different levels. The method 300 shown in FIG. 3 fulfills these needs and provides these advantages.

Figure 3:
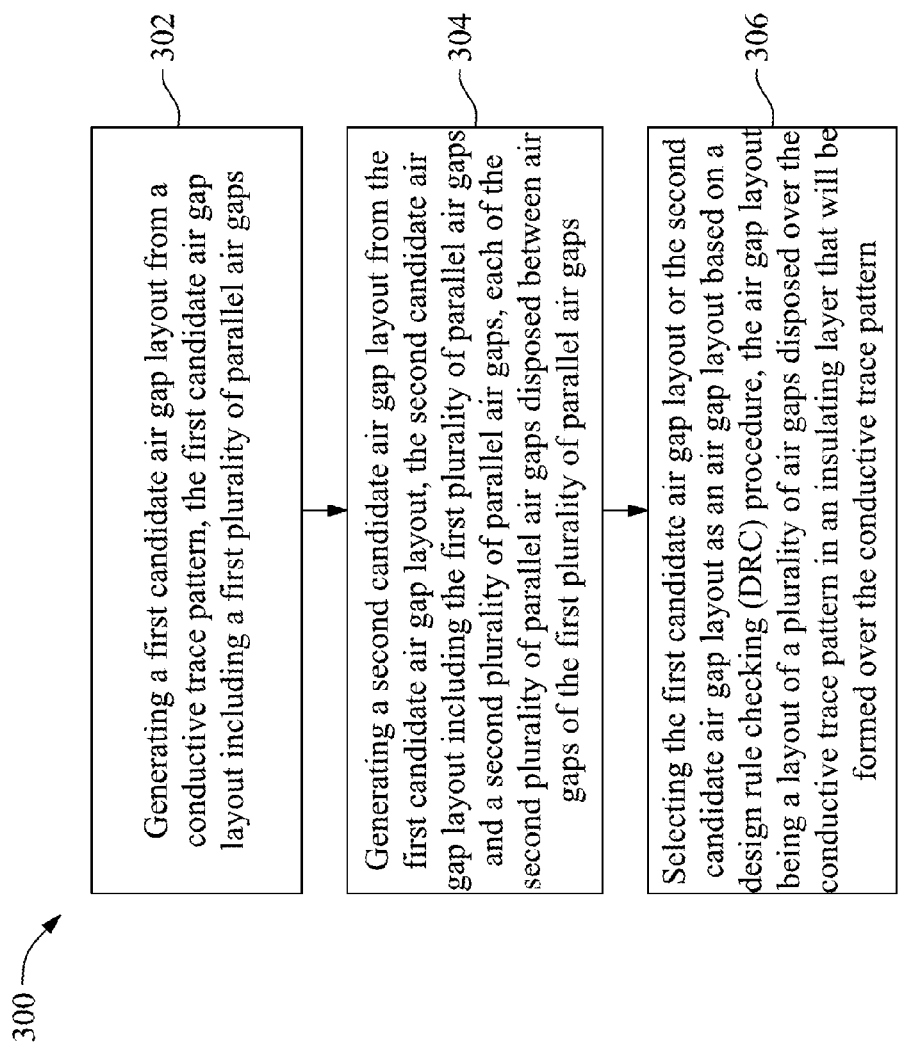
FIG. 3 shows a method of manufacturing a semiconductor device, in accordance with some embodiments.

FIG. 3 shows a method 300 of manufacturing a semiconductor device, in accordance with one or more embodiments. The method 300 may include: generating a first candidate air gap layout from a conductive trace pattern, the first candidate air gap layout including a first plurality of parallel air gaps (in 302); generating a second candidate air gap layout from the first candidate air gap layout, the second candidate air gap layout including the first plurality of parallel air gaps and a second plurality of parallel air gaps, each of the second plurality of parallel air gaps disposed between air gaps of the first plurality of parallel air gaps (in 304); and selecting the first candidate air gap layout or the second candidate air gap layout as an air gap layout based on a design rule checking (DRC) procedure, the air gap layout being a layout of a plurality of air gaps disposed over the conductive trace pattern in an insulating layer that will be formed over the conductive trace pattern (in 306).

Figure 4A:
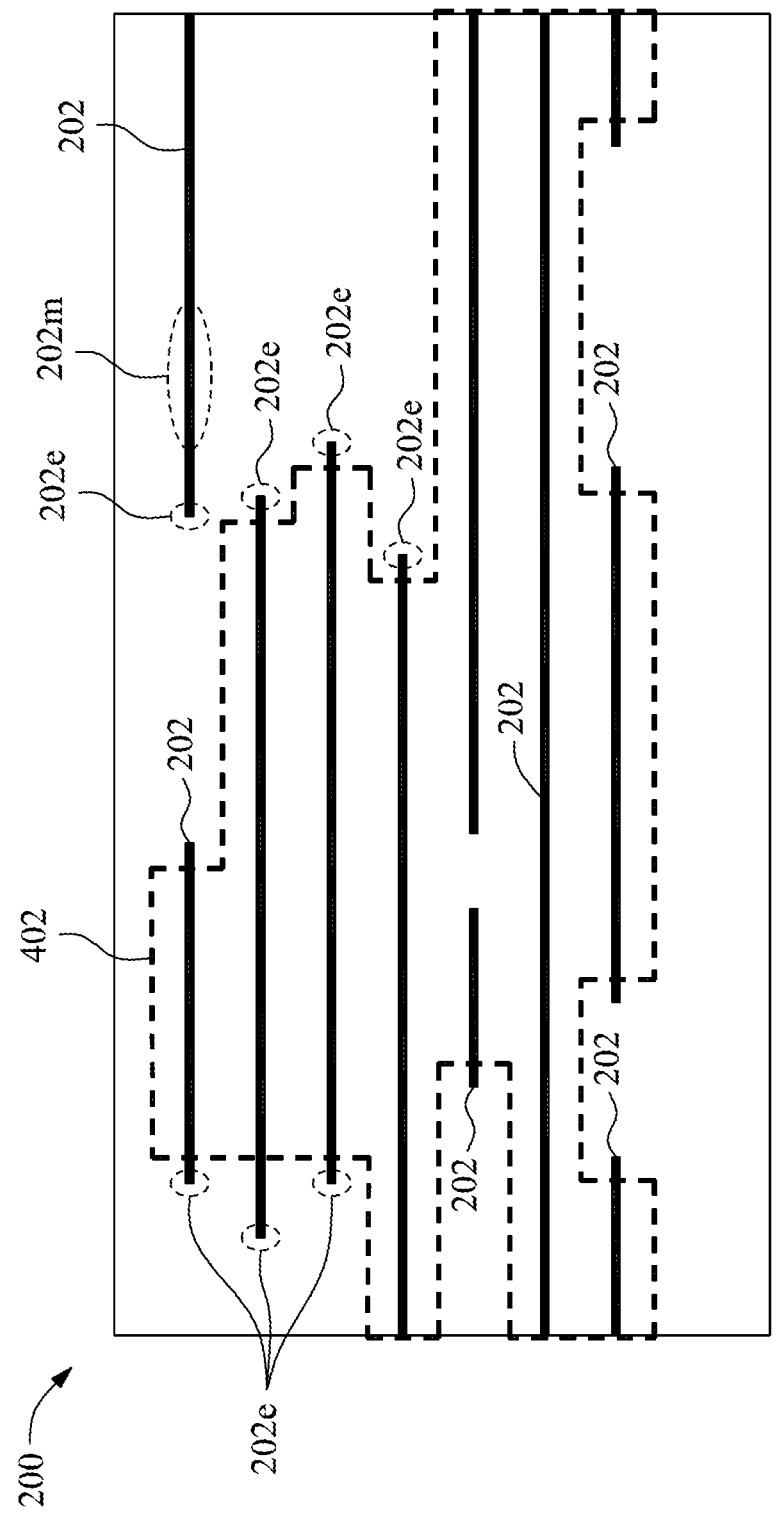
FIG. 4A to FIG. 4H show a process flow illustrating some of the steps of the method of FIG. 3, in accordance with some embodiments.

FIGS. 4A to 4H show a process flow illustrating some of the steps of the method 300 shown in FIG. 3, in accordance with one or more embodiments. FIG. 4A shows a polygon 402 generated from the conductive trace pattern 200. The polygon 402 may be used to determine the position and layout of the plurality of air gaps 124b in the dielectric material 124a that will be formed over the conductive trace pattern 200. In particular, the region outside the polygon 402 represents portions of the conductive trace pattern 200 that are completely covered by the dielectric material 124a of the IMD layer 122. In other words, the region outside the polygon 402 is devoid of the plurality of air gaps 124b. On the other hand, the region within the polygon 402 represents portions of the IMD layer 122 in which the plurality of air gaps 124b may be formed.

The polygon 402 may, as an example, approximate an area within which portions of the plurality of conductive traces 202 are disposed. In other words, the polygon 402 may be a boundary within which portions of the plurality of conductive traces 202 are routed. Stated in yet another way, the polygon 402 may approximate the shape of the region that is covered by the conductive trace pattern 200. As shown in FIG. 4A, some edge portions 202e of the plurality of conductive traces 202 may not be disposed within the polygon 402. Furthermore, some medial portions 202m of the plurality of conductive traces 202 may not be disposed within the polygon 402. In other words, the polygon 402 generated from the conductive trace pattern 200 may not cover some portions of the plurality of conductive traces 202. The portions of the plurality of conductive traces 202 that are not disposed within a boundary of the polygon 402 may be portions of the plurality of conductive traces 202 that interconnect with a metallization layer disposed above the plurality of conductive traces 202, as an example.

Figure 4B:
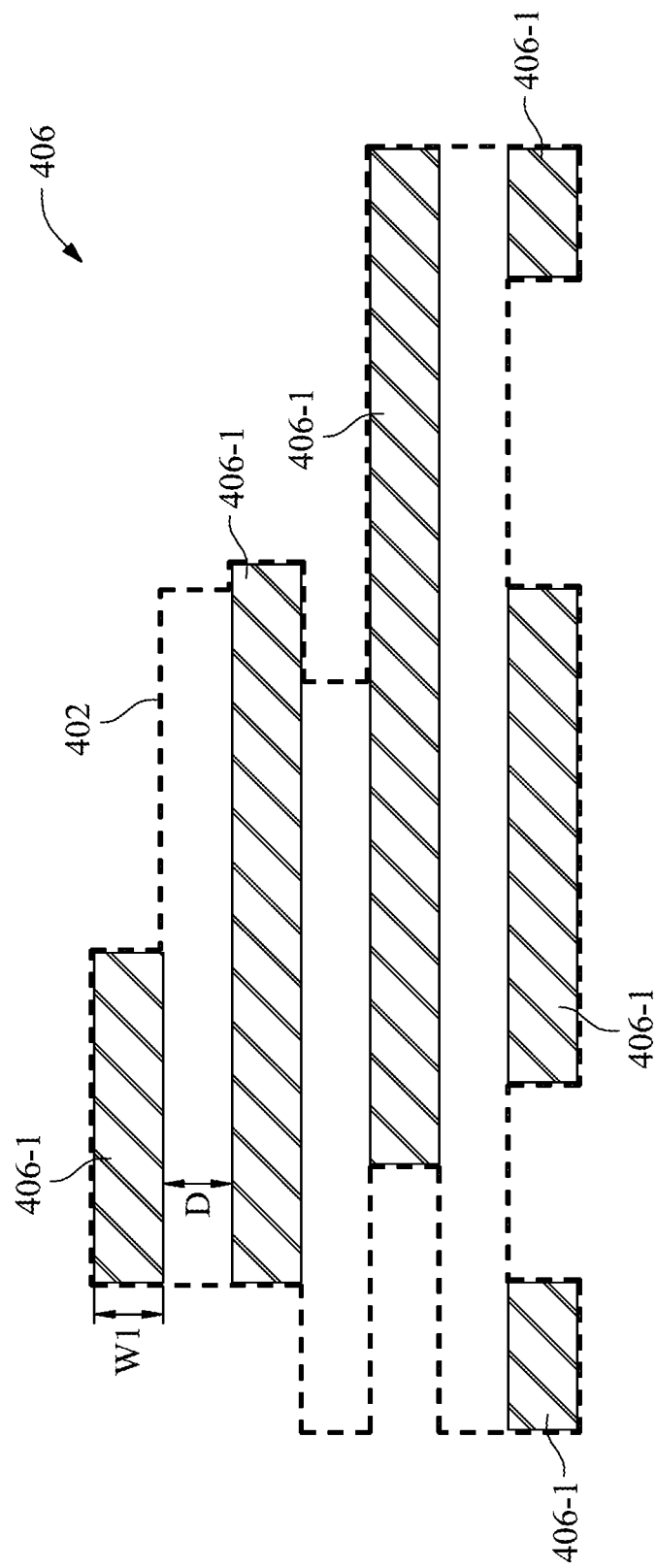

As shown in FIG. 4B, a first candidate air gap layout 406 may be generated from the conductive trace pattern 400. Specifically, the first candidate air gap layout 406 may be generated using the polygon 402 generated in FIG. 4A. The first candidate air gap layout 406 may be a possible pattern and layout of the plurality of air gaps 124b that is formed in the IMD layer 122 that will subsequently be disposed or formed over the conductive trace pattern 400. In the example of FIG. 4B, the first candidate air gap layout 406 may include a first plurality of parallel air gaps 406-1, which are disposed within the polygon 402. In other words, the first plurality of parallel air gaps 406-1 may be disposed within a boundary of the polygon 402. The first plurality of parallel air gaps 406-1 may extend in a direction substantially parallel to the plurality of conductive traces 202 of the conductive trace pattern 200, as shown in FIG. 4B.

The first plurality of parallel air gaps 406-1 may have a width W1 that is substantially equal to the pitch of the conductive traces disposed within the boundary of the polygon 402. Consequently, in the example shown in FIG. 4B, the width W1 of each of the first plurality of parallel air gaps 406-1 may be substantially equal to the pitch P. Furthermore, immediately adjacent air gaps of the first plurality of parallel air gaps 406-1 may be separated by a distance D that is substantially equal to the pitch P.

Figure 4C:
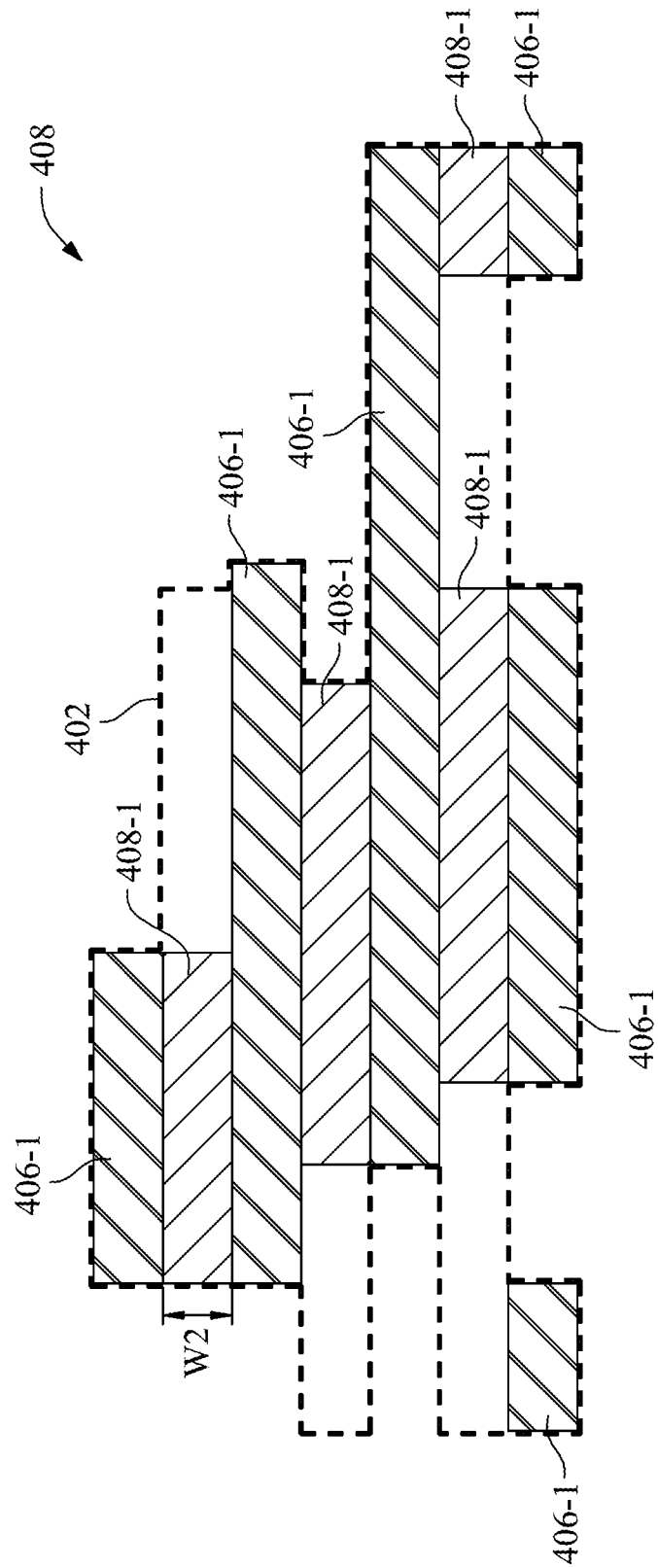

As shown in FIG. 4C, a second candidate air gap layout 408 may be generated from the first candidate air gap layout 406. The second candidate air gap layout 408 may include a second plurality of parallel air gaps 408-1 in addition to the first plurality of parallel air gaps 406-1. Both the first plurality of parallel air gaps 406-1 and the second plurality of parallel air gaps 408-1 may be disposed within the boundary of the polygon 402. The second plurality of parallel air gaps 408-1 may have a width W2 that is substantially equal to the pitch of the conductive traces disposed within the boundary of the polygon 402. Consequently, in the example shown in FIG. 4C, the width W2 of each air gap of the second plurality of parallel air gaps 408-1 may be substantially equal to the pitch P. Each of the second plurality of parallel air gaps 408-1 may be disposed between air gaps of the first plurality of parallel air gaps 406-1 that are immediately adjacent to each other. In other words, each of the second plurality of parallel air gaps 408-1 may be sandwiched between immediately adjacent air gaps of the first plurality of parallel air gaps 406-1, as shown in FIG. 4C. Since the distance D separating immediately adjacent air gaps of the first plurality of parallel air gaps 406-1 as well as the width W2 of each of the second plurality of parallel air gaps 408-1 is substantially equal to the pitch P, the second plurality of parallel air gaps 408-1 fills some regions between immediately adjacent air gaps of the first plurality of parallel air gaps 406-1.

Figure 4D:
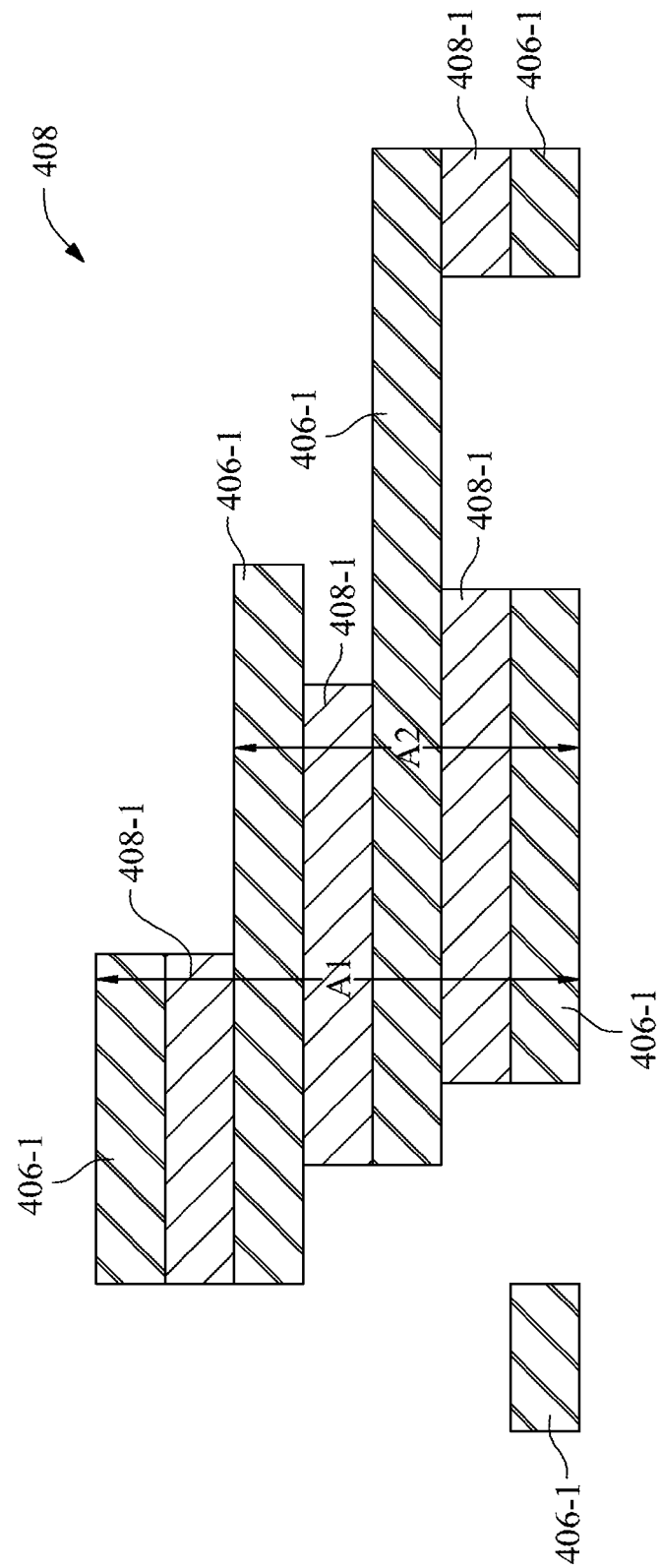

Following the generation of the second candidate air gap layout 408, a DRC procedure may be performed on the second candidate air gap layout 408 to determine whether the second candidate air gap layout 408 fulfills prescribed design rules. The second candidate air gap layout 408 on which the DRC procedure is performed is shown in FIG. 4D. FIG. 4D differs from FIG. 4C, in that the polygon 402, which demarcates the boundary within which the first plurality of parallel air gaps 406-1 and the second plurality of parallel air gaps 408-1 are formed, is removed. As shown in FIG. 4D, the second candidate air gap layout 408 has widths that are greater than or substantially equal to the pitch P. Accordingly, the second candidate air gap layout 408 avoids violations of minimum width. Furthermore, as shown in FIG. 4D, the second candidate air gap layout 408 is devoid of point touches and enclosed areas or pockets within the first plurality of parallel air gaps 406-1 and the second plurality of parallel air gaps 408-1. Accordingly, violations of these design rules are also avoided. However, portions of the second candidate air gap layout 408 may include wide lateral extents A1 and A2. Consequently, depending on the design rules, the second candidate air gap layout 408 may either fail or pass the DRC procedure, depending on the design criterion for wide areas A1 and A2.

In the event that the second candidate air gap layout 408 passes the DRC procedure, the second candidate air gap layout 408 is selected as the layout and pattern of the plurality of air gaps 124b of the IMD layer 122 that is formed over the conductive trace pattern 200. However, in the event that the second candidate air gap layout 408 fails the DRC procedure, the first candidate air gap layout 406 is selected as the layout and pattern of the plurality of air gaps 124b of the IMD layer 122 that is formed over the conductive trace pattern 200. It is noted that the first candidate air gap layout 406, which includes the first plurality of parallel air gaps 406-1 separated by a distance D, is able to fulfill all design rules that may be needed for the etching and/or lithographic processes that may be used to form the plurality of air gaps 124b. These design rules include avoiding violations of minimum widths, point touches, enclosed areas, and wide areas (e.g. wide metal areas), as examples. It is noted that regions of the polygon 402 that have neither the first plurality of parallel air gaps 406-1 nor the second plurality of parallel air gaps 408-1 denote regions that will be filled with a dielectric material.

Figure 4E:
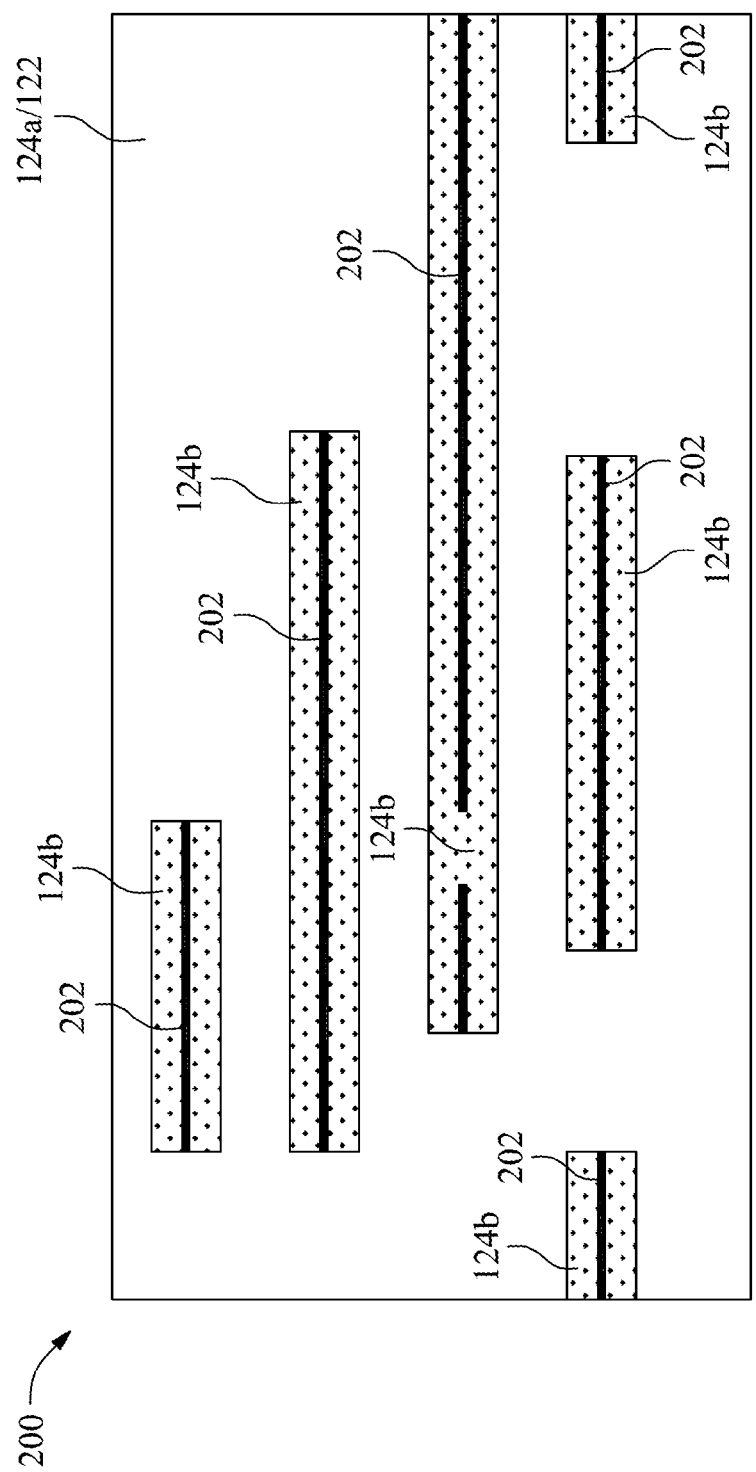

As an example, suppose that the second candidate air gap layout 408 fails the DRC procedure (e.g. due to violation of the criterion for wide areas Al and A2). Consequently, as shown in FIG. 4E, the first candidate air gap layout 406 is selected as the layout and pattern of the plurality of air gaps 124b of the IMD layer 122 that is formed over the conductive trace pattern 200. It is noted that some portions of the conductive trace pattern 200 are covered by the dielectric material 124a of the IMD layer 122, while other portions (such as the conductive traces 202 shown in FIG. 4E) are exposed by the plurality of air gaps 124b of the IMD layer 122.

Figure 4F:
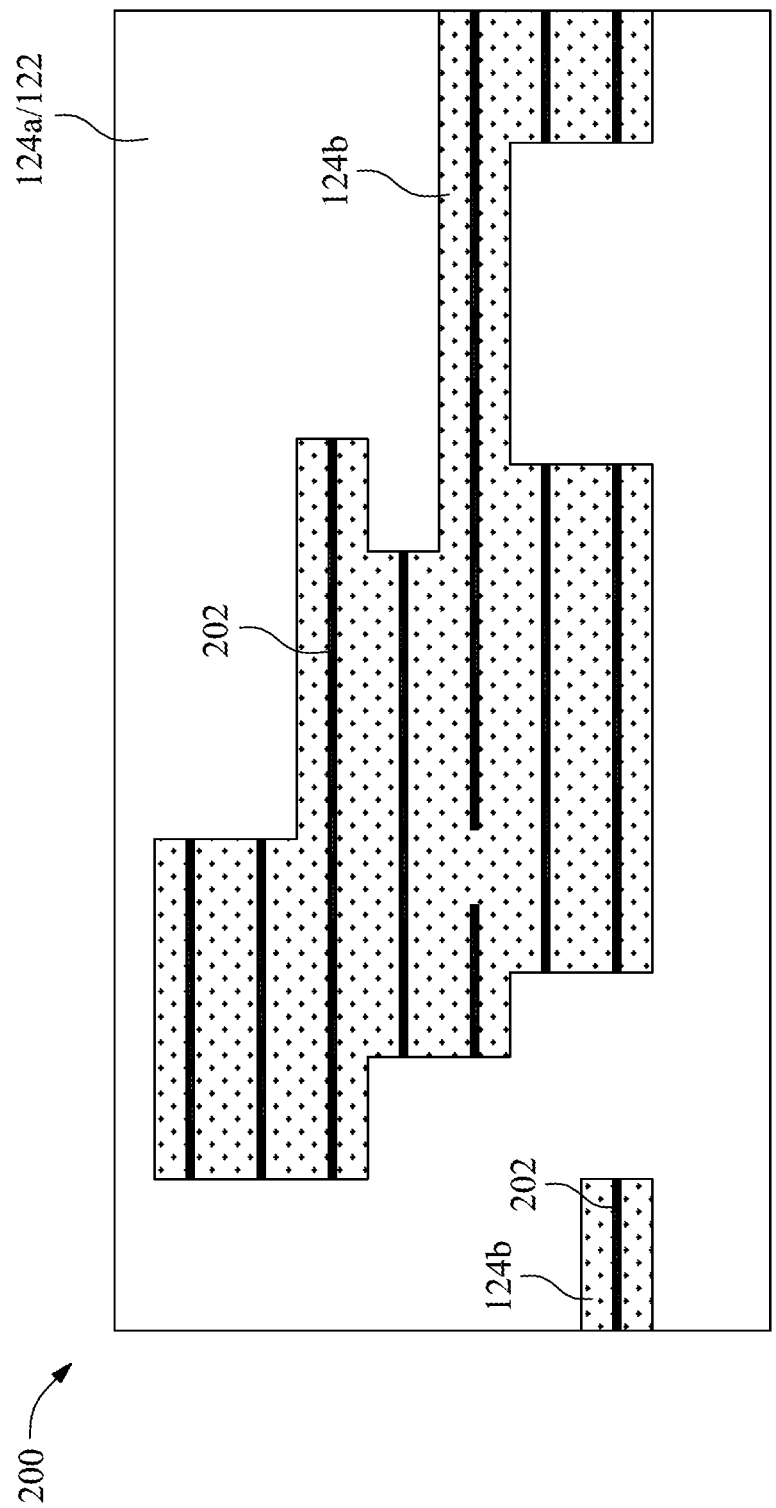

As a counterexample, suppose that the second candidate air gap layout 408 passes the DRC procedure. Consequently, as shown in FIG. 4F, the second candidate air gap layout 408 is selected as the layout and pattern of the plurality of air gaps 124b of the IMD layer 122 that is formed over the conductive trace pattern 200. It is noted that some portions of the conductive trace pattern 200 are covered by the dielectric material 124a of the IMD layer 122, while other portions (such as the conductive traces 202 shown in FIG. 4F) are exposed by the plurality of air gaps 12b of the IMD layer 122.

One advantage provided by the method 300 as well as the process flow illustrated in FIGS. 4A to 4F is provision of a layout or pattern of the plurality of air gaps 124b that automatically fulfills design rules of a DRC procedure. In particular, the first candidate air gap layout 406 inherently has a layout or pattern that is able to pass a DRC procedure due to the fact that it includes only the first plurality of parallel air gaps 406-1. For example, the first candidate air gap layout 406 including only the first plurality of parallel air gaps 406-1 is devoid of point touches, enclosed areas, and wide areas. Furthermore, each of the first plurality of parallel air gaps 406-1 of the first candidate air gap layout 406 has a width that is substantially equal to the pitch P, which is greater than the minimum width allowed by a DRC procedure.

Another advantage provided by the method 300 as well as the process flow illustrated in FIGS. 4A to 4F is that the layout of the plurality of air gaps 124b is automatically determined without the need for iteration. For example, in some methods of determining the layout of the plurality of air gaps, the layout may need to be modified or corrected in the event that the layout fails the DRC procedure. In such methods, the modified or corrected air gap layout is once again subjected to the DRC procedure and this process of modification, correcting, and checking is repeated until an air gap layout that passes the DRC procedure is obtained. Such methods are iterative in nature. However, the method 300 of manufacturing a semiconductor device as well as the process flow illustrated in FIGS. 4A to 4F does not require such iteration. As described above, the first candidate air gap layout 406 inherently has a layout or pattern that is able to pass the DRC procedure due to the fact that it includes only the first plurality of parallel air gaps 406-1. The second candidate air gap layout 408 is generated to maximize the region of dielectric material 124a in which the plurality of air gaps 124b is formed in order to maximize the capacitive decoupling between conductive traces at different levels. If the second candidate air gap layout 408 fails the DRC procedure, the layout or pattern of the plurality of air gaps 124 defaults to the first candidate air gap layout 406 without the need for another DRC procedure.

Further advantages provided by the method 300 as well as the process flow illustrated in FIGS. 4A to 4F include transparent design of the air gap layout, an increase in the rate at which air gaps are inserted in the dielectric material 124a of the IMD layer 122 (since iteration is not required), and a simple process flow that is able to systematically fulfill complex design rules.

Figure 4G:
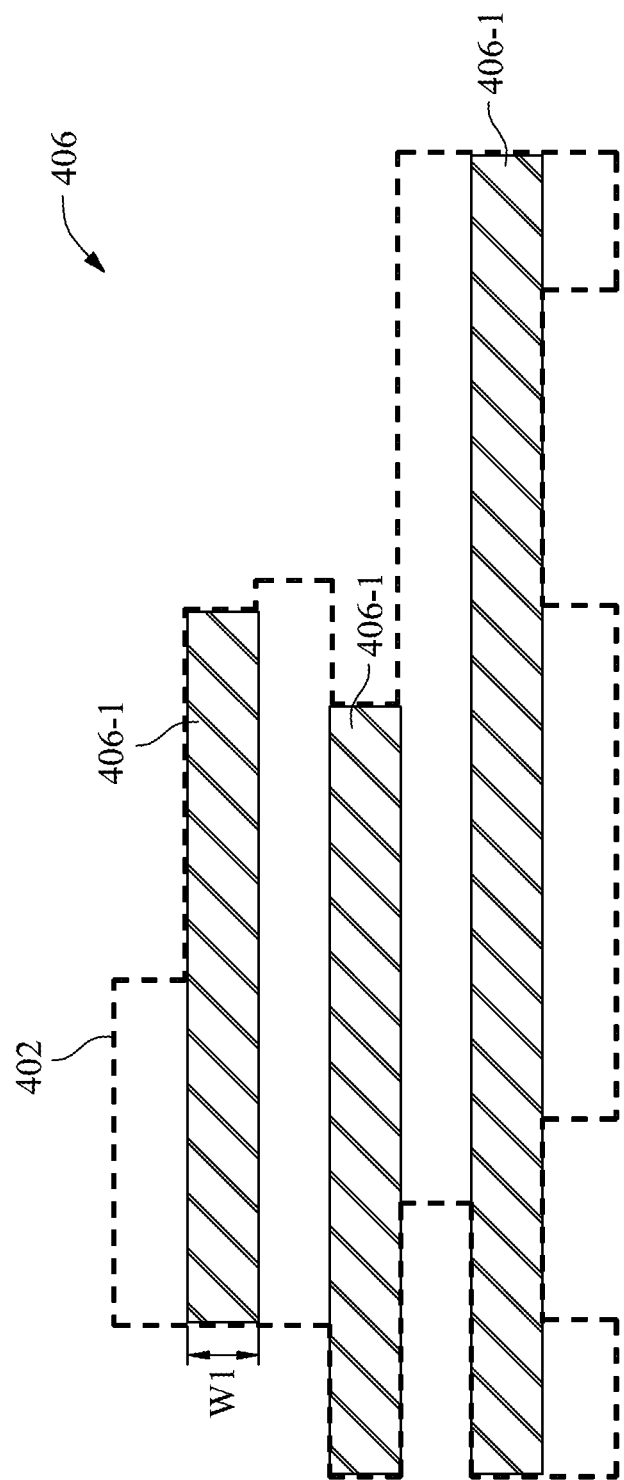
Figure 4H:
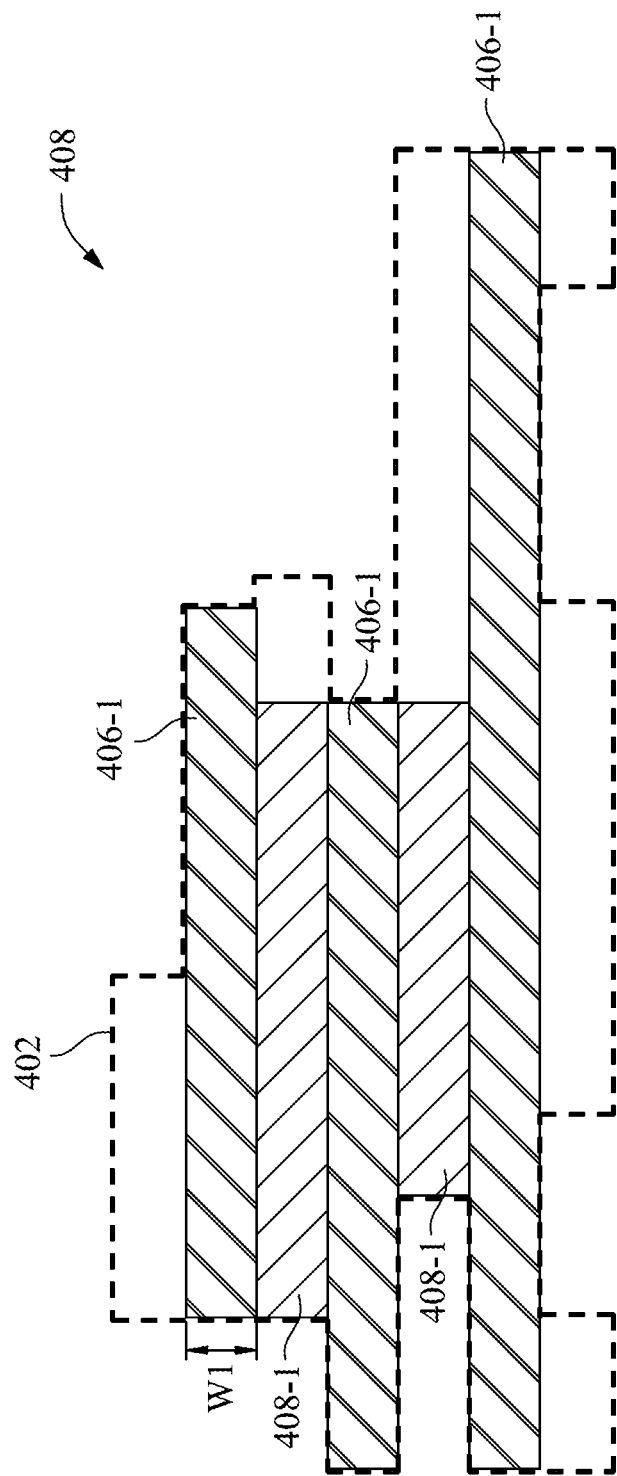

FIG. 4G shows another example of the first candidate air gap layout 406 that may be generated from the conductive trace pattern 200 shown in FIG. 2 and FIG. 4A. As shown in FIG. 4G, the first plurality of parallel air gaps 406-1 may be generated in a region that is a complement of the region shown in FIG. 4B. FIG. 4H shows the second candidate air gap layout 408 that is generated from the first candidate air gap layout 406 of FIG. 4G. As shown in FIG. 4H, the second plurality of parallel air gaps 408-1 is disposed in portions of the polygon 402 that are between air gaps of the first plurality of parallel air gaps 406-1 that are laterally adjacent to each other. The DRC procedure described above may then be performed on the second candidate air gap layout 408 of FIG. 4H, and either the air gap layout shown in FIG. 4G or the air gap layout shown in FIG. 4H may be chosen based on the result of the DRC procedure.

FIGS. 5A to 5D further illustrate how the first candidate air gap layout 406 automatically fulfills design rules of a DRC procedure. In particular, FIGS. 5A to 5D show portions of a polygon 502 that can violate design rules of a DRC procedure if the entire polygon 502 is used as a layout or pattern of the plurality of air gaps 124b. However, FIGS. 5A to 5D show how the first plurality of parallel air gaps 406-1 inherently and automatically avoids violation of these design rules.

Figure 5A:
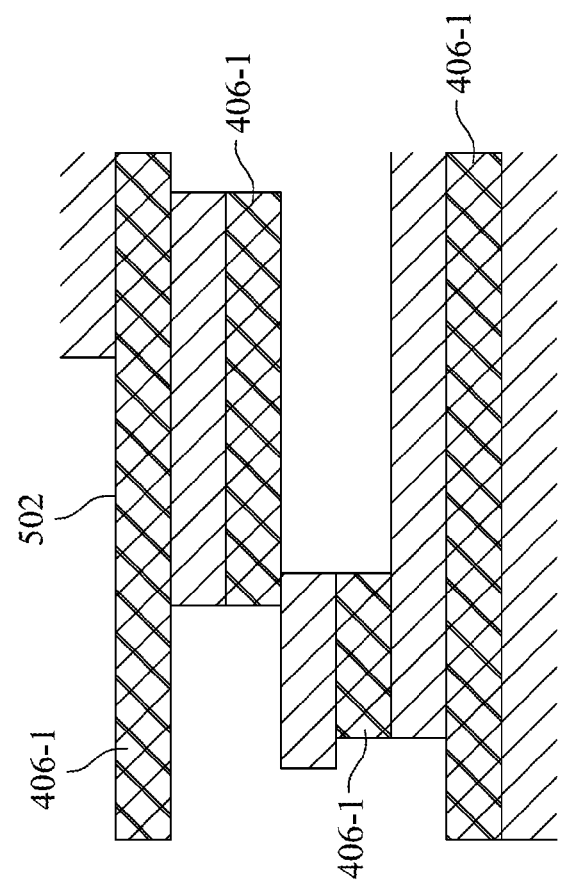
FIG. 5A to FIG. 5D show portions of a polygon that can violate design rules of a design rule check procedure, in accordance with some embodiments.
Figure 5A:
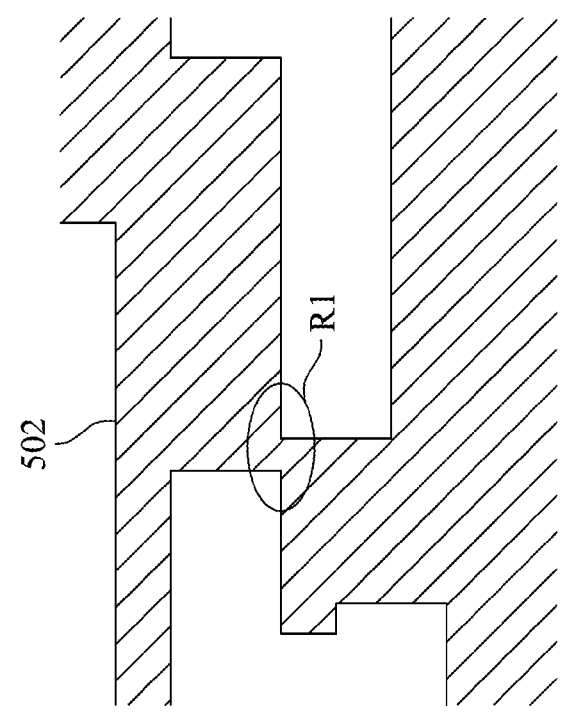

As shown in FIG. 5A, the polygon 502 may have a first region R1 that may violate a minimum width design rule of a DRC procedure. However, when the polygon 502 is filled with the first plurality of parallel air gaps 406-1, and the DRC procedure is performed on the layout or pattern of the first plurality of parallel air gaps 406-1, such a violation of the minimum width design rule is avoided.

Figure 5B:
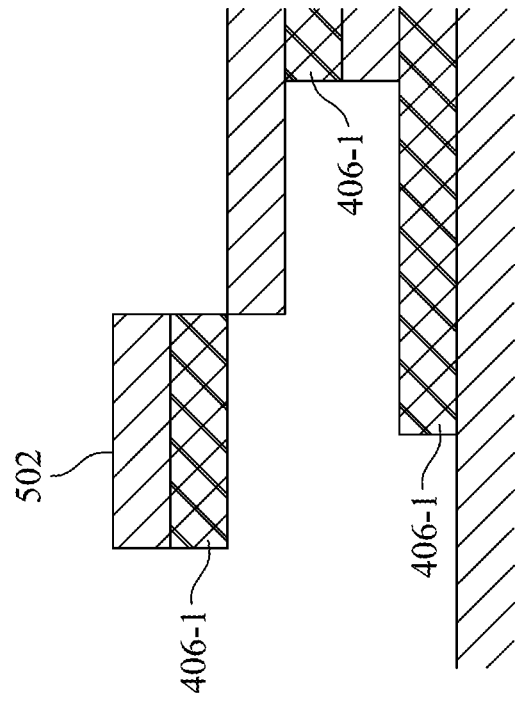
Figure 5B:
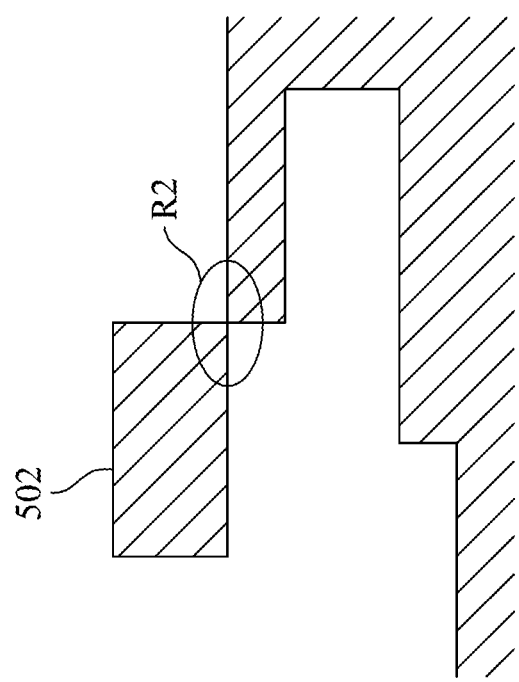

As shown in FIG. 5B, the polygon 502 may have a second region R2 that may violate a point touch design rule of a DRC procedure. However, when the polygon 502 is filled with the first plurality of parallel air gaps 406-1, and the DRC procedure is performed on the layout or pattern of the first plurality of parallel air gaps 406-1, such a violation of the point touch design rule is avoided.

Figure 5C:
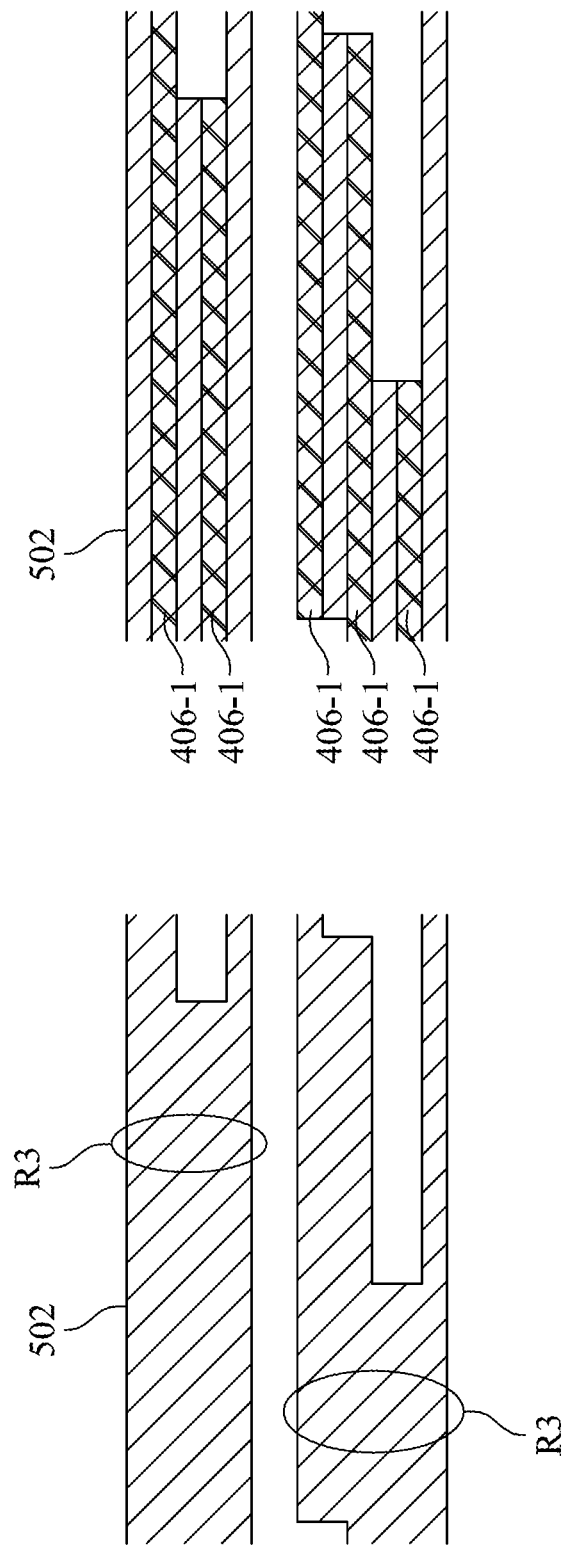

As shown in FIG. 5C, the polygon 502 may have a third region R3 that may violate a wide area design rule of a DRC procedure. However, when the polygon 502 is filled with the first plurality of parallel air gaps 406-1, and the DRC procedure is performed on the layout or pattern of the first plurality of parallel air gaps 406-1, such a violation of the wide area design rule is avoided.

Figure 5D:
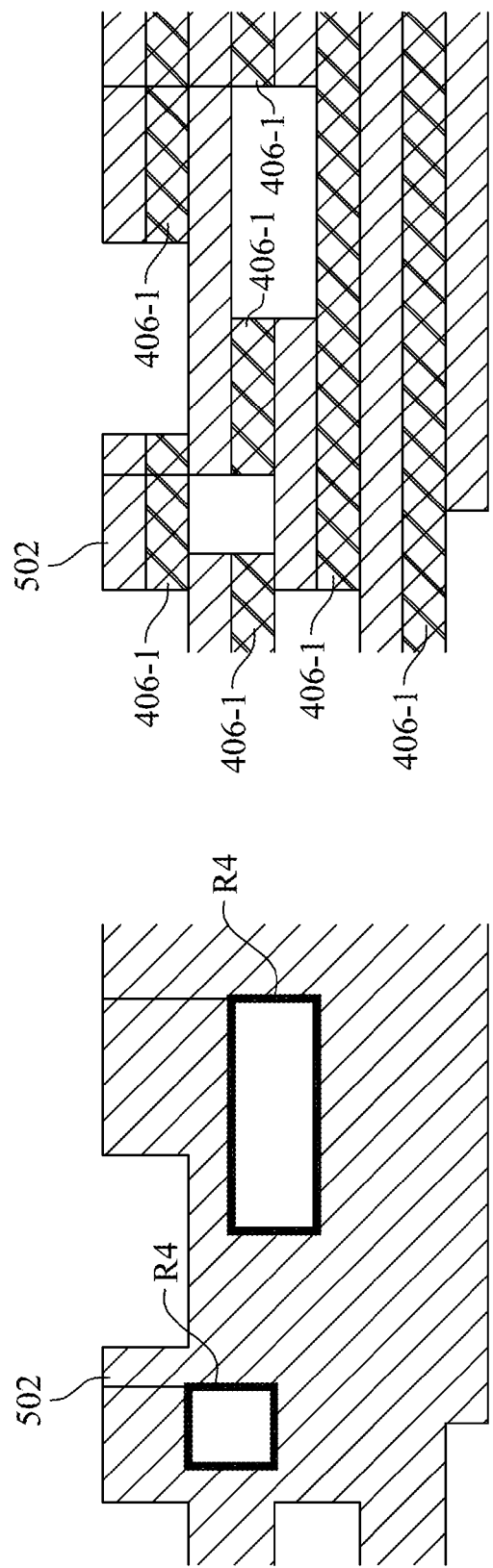

As shown in FIG. 5D, the polygon 502 may have a fourth region R4 that may violate an enclosed area design rule of a DRC procedure. However, when the polygon 502 is filled with the first plurality of parallel air gaps 406-1, and the DRC procedure is performed on the layout or pattern of the first plurality of parallel air gaps 406-1, such a violation of the enclosed area design rule is avoided.

Figure 6:
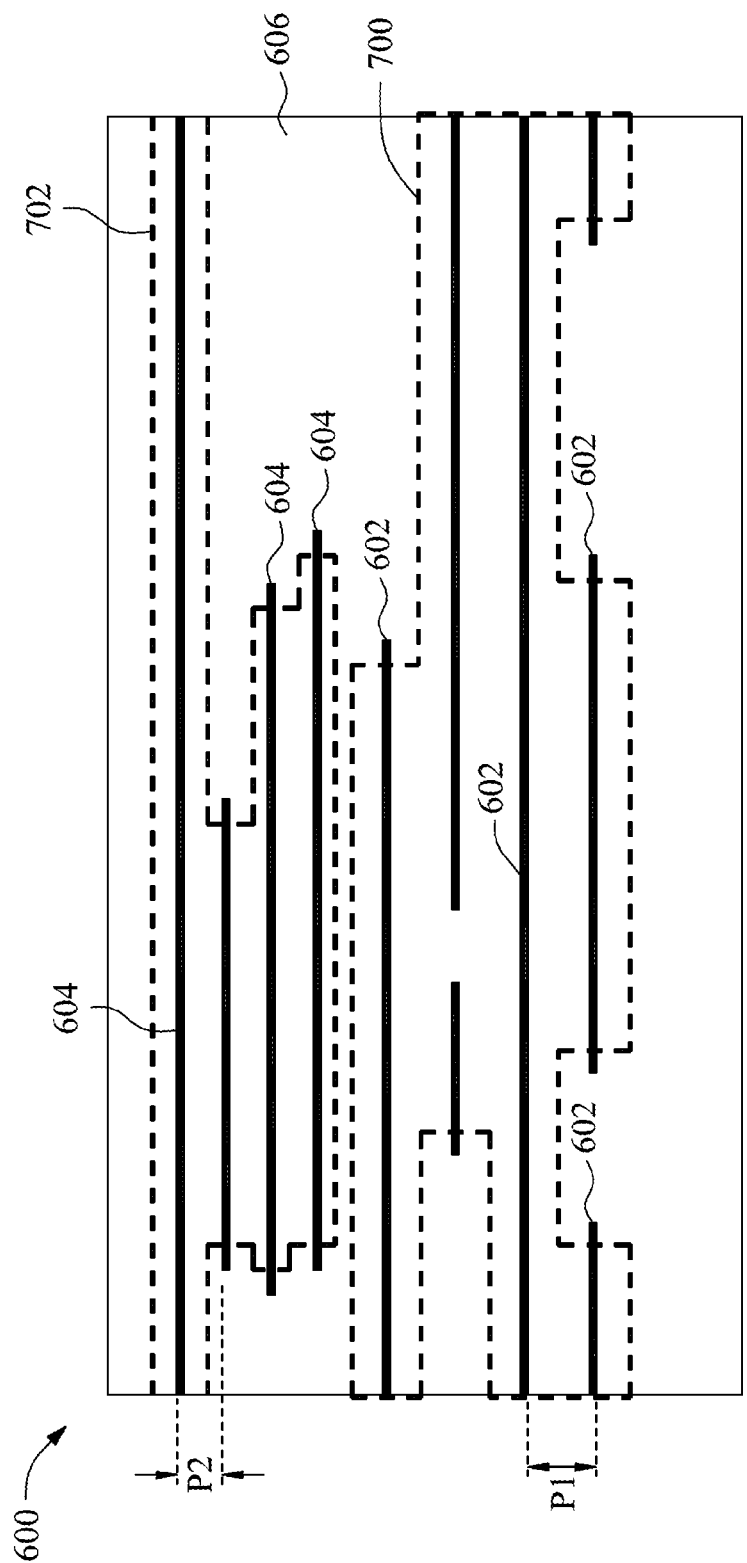
FIG. 6 shows a conductive trace pattern including a first plurality of conductive traces and a second plurality of conductive traces, in accordance with some embodiments.

FIG. 6 shows a plan view of a conductive trace pattern 600, in accordance with one or more embodiments. As shown in FIG. 6, the conductive trace pattern 600 may include a first plurality of conductive traces 602 and a second plurality of conductive traces 604 extending laterally across a surface 606, which may be a surface of the dielectric material 114a of the bottom metal layer 114 or a surface of the dielectric material 120a of one of the plurality of middle metal layers 120. The first plurality of conductive traces 602 may have a first pitch P1, and the second plurality of conductive traces 604 may have a second pitch P2, which may be different from the first pitch P1. The first pitch P1 and the second pitch P2 may be in the range from about 1 μm to about 10 μm, although other distances may be possible as well.

As shown in FIG. 6, a first polygon 700 and a second polygon 702 may be generated from the conductive trace pattern 600. The first polygon 700 and the second polygon 702 may be used to determine the position and layout of the plurality of air gaps 124b in the dielectric material 124a that will be formed over the conductive trace pattern 600. In particular, the regions outside the first polygon 700 and the second polygon 702 represents portions of the conductive trace pattern 600 that will be completely covered by the dielectric material 124a of the IMD layer 122. In other words, the regions outside the first polygon 700 and the second polygon 702 are devoid of the plurality of air gaps 124b. On the other hand, the regions within the first polygon 700 and the second polygon 702 represent portions of the IMD layer 122 in which the plurality of air gaps 124b may be formed.

The first polygon 700 may, as an example, approximate an area within which portions of the first plurality of conductive traces 602 are disposed. In other words, the first polygon 700 may be a boundary within which portions of the first plurality of conductive traces 602 are routed. Stated in yet another way, the first polygon 700 may approximate the shape of the region that is covered by the first plurality of conductive traces 602.

Similarly, the second polygon 702 may, as an example, approximate an area within which portions of the second plurality of conductive traces 604 are disposed. In other words, the second polygon 702 may be a boundary within which portions of the second plurality of conductive traces 604 are routed. Stated in yet another way, the second polygon 702 may approximate the shape of the region that is covered by the second plurality of conductive traces 604. Consequently, the conductive trace pattern 600 shown in FIG. 6 may be grouped according to pitch. For example, a first group of conductive traces corresponding to conductive traces having the first pitch P1 may be spatially grouped together and may be approximated by the first polygon 700. Similarly, a second group of conductive traces corresponding to conductive traces having the second pitch P2 may be spatially grouped together and may be approximated by the second polygon 702. Thereafter, the method 300 shown in FIG. 3 and the process flow described above in relation to FIG. 4A to FIG. 4F may be performed separately on the first polygon 700 and the second polygon 702. This method 300 may be performed on the first polygon 700 in parallel to the second polygon 702, or the method 300 may be performed in series on the first polygon 700 and the second polygon 702.

According to various embodiments presented herein, a method of manufacturing a semiconductor device is provided. The method may include: generating a first candidate air gap layout from a conductive trace pattern, the first candidate air gap layout including a first plurality of parallel air gaps; generating a second candidate air gap layout from the first candidate air gap layout, the second candidate air gap layout including the first plurality of parallel air gaps and a second plurality of parallel air gaps, each of the second plurality of parallel air gaps disposed between air gaps of the first plurality of parallel air gaps; and selecting the first candidate air gap layout or the second candidate air gap layout as an air gap layout based on a design rule checking (DRC) procedure, the air gap layout being a layout of a plurality of air gaps disposed over the conductive trace pattern in an insulating layer that will be formed over the conductive trace pattern.

According to various embodiments presented herein, a method of manufacturing a semiconductor device is provided. The method may include: providing a substrate having a metal layer disposed thereon, the metal layer having a conductive trace pattern formed therein; depositing a dielectric material over the conductive trace pattern of the metal layer; determining a layout of a plurality of air gaps that will be formed in the dielectric material based on a design rule checking (DRC) procedure and the conductive trace pattern; and forming the plurality of air gaps in the dielectric material based on the layout of the plurality of air gaps.

According to various embodiments presented herein, a method of manufacturing a semiconductor device is provided. The method may include: determining a boundary of a region within which a conductive trace pattern is disposed; generating a first candidate air gap layout based on the boundary, the first candidate air gap layout comprising a first plurality of parallel air gaps disposed within the boundary; generating a second candidate air gap layout from the first candidate air gap layout, the second candidate air gap layout comprising the first plurality of parallel air gaps and a second plurality of parallel air gaps, each of the second plurality of parallel air gaps disposed between immediately adjacent air gaps of the first plurality of parallel air gaps; and selecting the first candidate air gap layout or the second candidate air gap layout as a layout of air gaps that will be formed in an insulating layer over the conductive trace pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    generating a first candidate air gap layout of an insulating layer from a conductive trace pattern, the first candidate air gap layout comprising a first plurality of parallel air gaps;
    generating a second candidate air gap layout of the insulating layer from the first candidate air gap layout, the second candidate air gap layout comprising the first plurality of parallel air gaps and a second plurality of parallel air gaps, each of the second plurality of parallel air gaps disposed between air gaps of the first plurality of parallel air gaps;
    selecting the first candidate air gap layout or the second candidate air gap layout as an air gap layout based on a design rule checking (DRC) procedure, the air gap layout being a layout of a plurality of air gaps disposed over the conductive trace pattern in the insulating layer that will be formed over the conductive trace pattern; and
    forming the insulating layer based on the air gap layout.

2. The method of claim 1, the forming the insulating layer comprising:
    depositing the insulating layer over the conductive trace pattern; and
    forming the plurality of air gaps in the insulating layer based on the air gap layout.

3. The method of claim 1, wherein the conductive trace pattern has a first pitch, and wherein a width of each of the first plurality of parallel air gaps is substantially equal to the first pitch.

4. The method of claim 3, wherein immediately adjacent air gaps of the first plurality of parallel air gaps are separated by a distance substantially equal to the first pitch.

5. The method of claim 3, wherein a width of each of the second plurality of parallel air gaps is substantially equal to the first pitch.

6. The method of claim 1, wherein the generating the first candidate air gap layout from the conductive trace pattern comprises:
    generating a polygon from the conductive trace pattern, the polygon being a boundary within which portions of the conductive trace pattern are routed; and
    generating the first plurality of parallel air gaps within the polygon.

7. The method of claim 1, wherein the first plurality of parallel air gaps extends in a direction substantially parallel to the conductive trace pattern.

8. The method of claim 1, wherein the selecting the first candidate air gap layout or the second candidate air gap layout as the air gap layout based on the DRC procedure comprises:
    performing the DRC procedure on the second candidate air gap layout;

selecting the second candidate air gap layout as the air gap layout in case the second candidate air gap layout passes the DRC procedure; and selecting the first candidate air gap layout as the air gap layout in case the second candidate air gap layout fails the DRC procedure.

9. A method of manufacturing a semiconductor device, the method comprising:
providing a substrate having a metal layer disposed thereon, the metal layer having a conductive trace pattern formed therein;
depositing a dielectric material layer over the conductive trace pattern of the metal layer;
determining a layout of a plurality of air gaps that will be formed in the dielectric material layer based on a design rule checking (DRC) procedure and the conductive trace pattern comprising:
generating a first candidate air gap layout comprising a first plurality of parallel air gaps within a boundary of the dielectric material layer;
generating a second candidate air gap layout comprising the first plurality of parallel air gaps and a second plurality of parallel air gaps within the boundary, each of the second plurality of parallel air gaps disposed between air gaps of the first plurality of parallel air gaps; and
selecting the first candidate air gap layout or the second candidate air gap layout as the layout of the plurality of air gaps based on the DRC procedure; and
forming the plurality of air gaps in the dielectric material layer based on the layout of the plurality of air gaps.

10. The method of claim 9, wherein the determining the layout of the plurality of air gaps further comprises:
before generating the first candidate air gap layout and the second candidate air gap layout, determining a boundary within which portions of the conductive trace pattern are routed; and
after generating the second candidate air gap layout, performing the DRC procedure on the second candidate air gap layout.

11. The method of claim 9, wherein the selecting the first candidate air gap layout or the second candidate air gap layout comprises selecting the second candidate air gap layout as the layout of the plurality of air gaps in case the second candidate air gap layout passes the DRC procedure; and
selecting the first candidate air gap layout as the layout of the plurality of air gaps in case the second candidate air gap layout fails the DRC procedure.

12. The method of claim 9, wherein the first plurality of parallel air gaps extends in a direction substantially parallel to the conductive trace pattern.

13. The method of claim 9, wherein the first plurality of parallel air gaps overlaps portions of the conductive trace pattern.

14. The method of claim 9, wherein the conductive trace pattern has a first pitch, and wherein a width of each of the first plurality of parallel air gaps is substantially equal to the first pitch.

15. The method of claim 14, wherein immediately adjacent air gaps of the first plurality of parallel air gaps are separated by a distance substantially equal to the first pitch.

16. The method of claim 14, wherein a width of each of the second plurality of parallel air gaps is substantially equal to the first pitch.

17. A method of manufacturing a semiconductor device, the method comprising:
determining a boundary of a region within which a conductive trace pattern is disposed;
generating a first candidate air gap layout in an insulating layer based on the boundary, the first candidate air gap layout comprising a first plurality of parallel air gaps disposed within the boundary;
generating a second candidate air gap layout in the insulating layer from the first candidate air gap layout, the second candidate air gap layout comprising the first plurality of parallel air gaps and a second plurality of parallel air gaps, each of the second plurality of parallel air gaps disposed between immediately adjacent air gaps of the first plurality of parallel air gaps;
selecting the first candidate air gap layout or the second candidate air gap layout as a layout of air gaps that will be formed in the insulating layer over the conductive trace pattern;
forming the insulating layer; and
forming a plurality of air gaps in the insulating layer based on the layout of air gaps.

18. The method of claim 17, wherein the selecting is based on a design rule checking (DRC) procedure performed on the second candidate air gap layout, and wherein selecting comprises:
selecting the second candidate air gap layout as the layout of air gaps in case the second candidate air gap layout passes the DRC procedure; and
selecting the first candidate air gap layout as the layout of air gaps in case the second candidate air gap layout fails the DRC procedure.

19. The method of claim 17, wherein the conductive trace pattern has a first pitch, and wherein a width of each of the first plurality of parallel air gaps is substantially equal to the first pitch.

20. The method of claim 18, wherein the first plurality of parallel air gaps overlays portions of the conductive trace pattern.

* * * * *